United States Patent [19]

Yoshikawa

[11] Patent Number: 5,053,840
[45] Date of Patent: Oct. 1, 1991

[54] SEMICONDUCTOR DEVICE HAVING A GATE ELECTRODE CONSISTING OF A PLURALITY OF LAYERS

[75] Inventor: Kuniyoshi Yoshikawa, Tokyo, Japan

[73] Assignee: Kabushiki Kaisha Toshiba, Kawasaki, Japan

[21] Appl. No.: 409,687

[22] Filed: Sep. 20, 1989

[30] Foreign Application Priority Data

Sep. 26, 1988 [JP] Japan .................................. 63-240002

[51] Int. Cl.⁵ ..................... H01C 29/68; H01C 29/10; H01C 29/78; H01C 27/02
[52] U.S. Cl. ................................. 357/23.5; 357/23.3; 357/23.6; 357/41; 357/45
[58] Field of Search ................... 357/23.5, 23.3, 23.6, 357/41, 45, 67 S

[56] References Cited

U.S. PATENT DOCUMENTS 4,377,818 3/1983 Kuo ...................................... 357/23.5
4,630,085 12/1986 Koyama ............................. 357/23.5
4,763,177 8/1988 Paterson ............................ 357/23.5

FOREIGN PATENT DOCUMENTS

3346831A1 1/1983 Fed. Rep. of Germany .
53-124085 10/1978 Japan .
56-66069 6/1981 Japan .

OTHER PUBLICATIONS

IBM (Technical Disclosure Bulletin); "Selective oxidation of Titanium While Forming Titanium Silicide at Polysilicon and Diffusions"; 3/85; pp. 5870–5875.
Esquivel et al., "High Density Contractless, Self Aligned EPROM Cell Array Technology", IEDM Technical Digest, IEEE, pp. 592–595, Dec. 7, 1986.
International Electron Devices Meeting, Dec. 11–14, 1988, San Francisco, pp. 432–435, K. Yoshikawa et al, "An Asymmetrical Lightly-Doped Source (ALDS) Cell For Virtual Ground High Density EPROMS".

*Primary Examiner*—Rolf Hille
*Assistant Examiner*—Wael Fahmy
*Attorney, Agent, or Firm*—Finnegan, Henderson, Farabow, Garrett, and Dunner

[57] ABSTRACT

Disclosed is a semiconductor device having a gate electrode consisting of a plurality of layers. The semiconductor device comprises a substrate, a first diffusion layer formed in the substrate, a second diffusion layer formed in the substrate, a floating gate electrode formed on a channel region between the first and second diffusion layers in an electrically floating state, and a control gate electrode formed on the floating gate electrode with an insulating film interposed therebetween. The first and second diffusion layers extend in parallel with each other along the longer side of the floating gate electrode. The control gate electrode extends in parallel with the shorter side of the floating gate electrode. The wiring layers for the first and second diffusion layers extend across the wiring layer for the control gate electrodes. Further, that portion of the first diffusion layer which is positioned adjacent to the floating gate electrode differs in impurity concentration from that portion of the second diffusion layer which is positioned adjacent to the floating gate electrode.

16 Claims, 5 Drawing Sheets

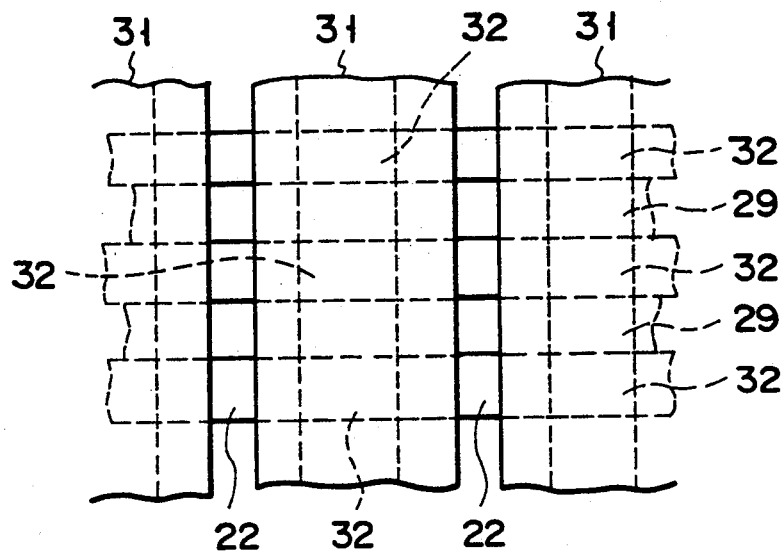
F I G. 3
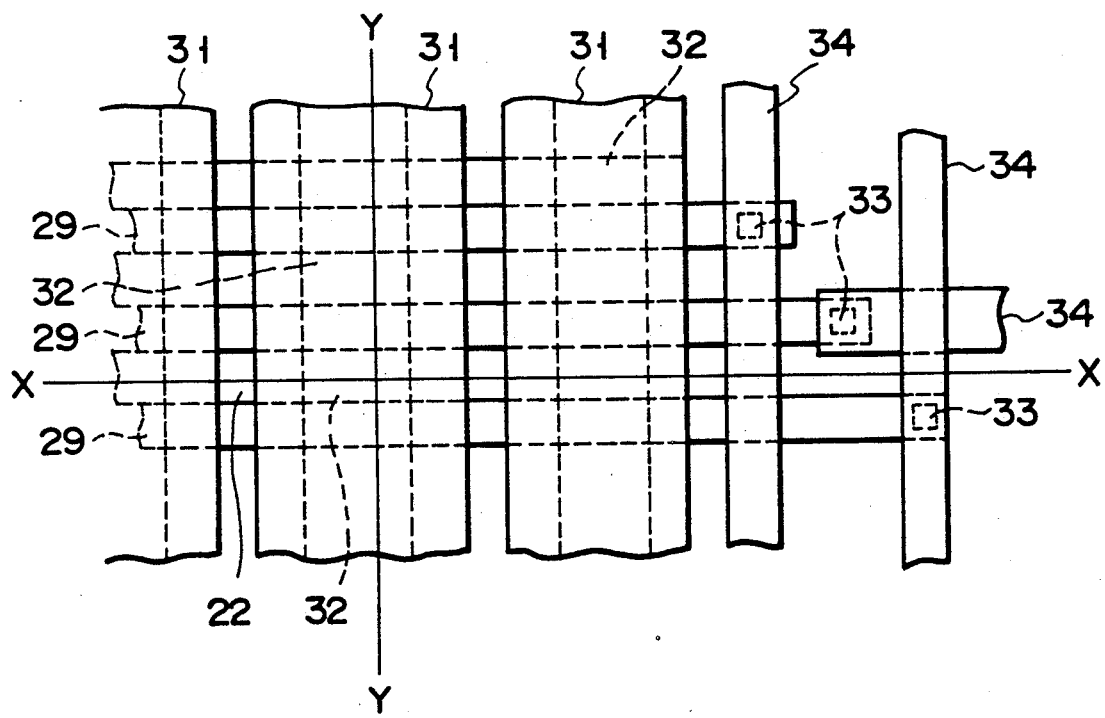
F I G. 4

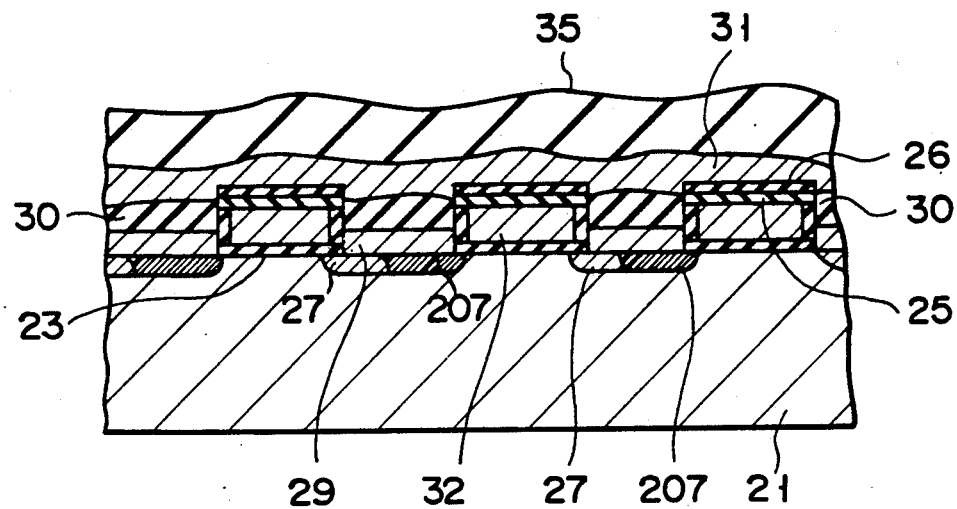
F I G. 5
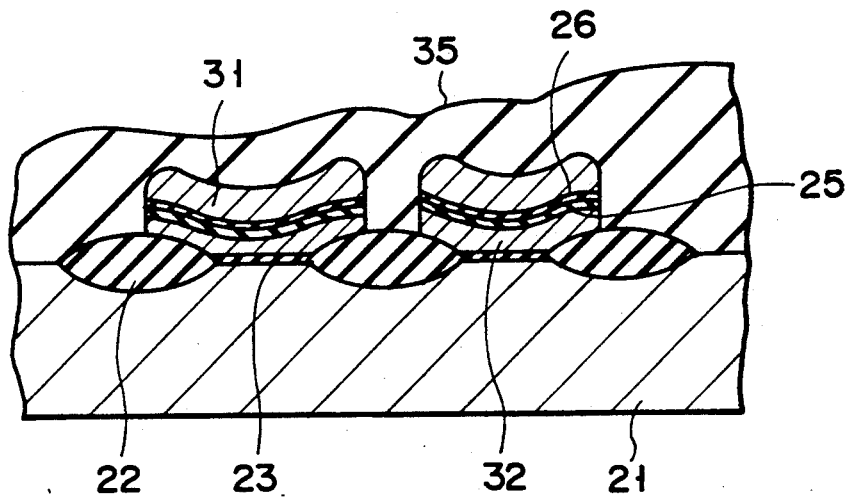
F I G. 6

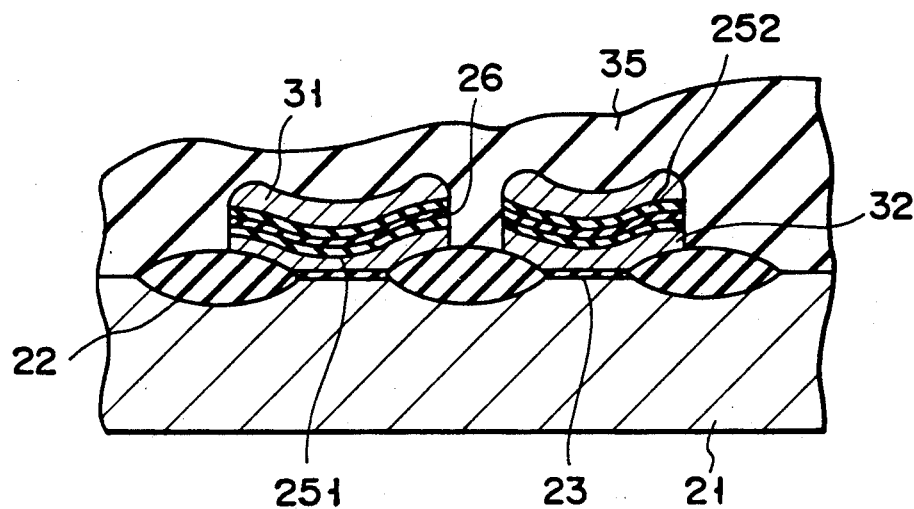
F I G. 7

SEMICONDUCTOR DEVICE HAVING A GATE ELECTRODE CONSISTING OF A PLURALITY OF LAYERS

BACKGROUND OF THE INVENTION

1. Field of the Invention

The present invention relates to a semiconductor device having a gate electrode consisting of a plurality of layers, particularly to a semiconductor device with improved gate electrode arrangement and improved impurity concentration of the diffusion layer.

2. Description of the Related Art

FIG. 8 shows the arrangement of a conventional EPROM having a gate electrode consisting of two layers. As seen from the drawing, the length of a control gate electrode 4 is about 1.3 times the length of the longer side of a single floating gate electrode 3 and about 4 times the length of the shorter side of the single floating gate electrode 3 in each unit cell 5. Also, the width of the control gate electrode 4 is equal to the length of the shorter side of the single floating gate electrode 3.

The particular construction described above causes the wiring resistance of the control gate electrode 4 not to be negligible because of the recent trend toward miniaturization of the width of the control gate electrode, i.e., the width of the polysilicon layer included in the gate. As a result, it is difficult to increase the capacity of the EPROM and to operate the EPROM at high speed. Several measures are being proposed in order to overcome these difficulties. For example, it is proposed to use a silicide material for forming the control gate electrode 4. However, the use of a silicide material fails to provide a satisfactory solution to the problem as, for example, the use of the silicide material makes it difficult to provide a sufficient margin in fine processing and gives rise to breakage of the wiring at the stepped portion.

What should also be noted is that the single cell 5 includes half of a drain contact hole 1. Thus, in determining the cell size, it is necessary to secure in advance a predetermined region, which is defined by the masking step, for each of the contact hole 1 and an element isolating region 2 and to secure an allowance for the deviation. It is also necessary to secure in advance a predetermined region, which is defined by the masking step, for each of the contact hole 1 and the floating gate electrode 3 and to secure an allowance for that deviation as well. It follows that the prior art shown in FIG. 8 leaves room for further improvement with respect to miniaturization of the device and enlargement of the memory capacity.

FIG. 9 shows another example of the prior art relating to the cell arrangement proposed for increasing the memory capacity. This prior art comprises a source diffusion layer, a drain diffusion layer, a floating gate electrode formed on a channel region between the source diffusion layer and the drain diffusion layer, and a control gate electrode formed on the floating gate electrode with an insulating layer interposed therebetween. The floating gate electrode is in an electrically floating state. It should be noted that the source diffusion layer and the drain diffusion layer are formed in parallel in the width direction of the floating gate electrode. Also, the control gate electrode is formed in parallel with the channel direction of the floating gate electrode, i.e., the current flow direction. Further, the wiring of the control gate electrode extends so as to cross the source diffusion layer and the drain diffusion layer.

In the prior art shown in FIG. 9, the diffusion layers arranged in parallel are decoded in accordance with the position of a selecting cell 8 so as to designate a drain (High voltage) 6 and a source (0V) 7. When information is written, the diffusion layers having the selecting cell 8 interposed therebetween are designated as the drain 6 and the source 7. In the adjacent cell sharing the drain 6, the diffusion layer 9 corresponding to the source is set as an open, so as to prevent an unintentional writing. Even if the diffusion layer 9 is set as the open, the diffusion layer has a large capacitance and, thus, a charging current flows to charge the diffusion layer until the potential of the diffusion layer becomes equal to that of the adjacent diffusion layer. The flowing time of the charging current is increased along with the increase in the element density. What should be noted is that channel hot electrons generated near the drain during the flow of the charging current are injected into the floating gate electrode, resulting in an unintentional writing and, thus, in an erroneous operation of the device.

SUMMARY OF THE INVENTION

According to the present invention, there is provided a semiconductor device having a gate electrode consisting of a plurality of layers, said semiconductor device comprising a substrate, a first diffusion layer formed in the substrate, a second diffusion layer formed in the substrate, a floating gate electrode formed on a channel region between the first and second diffusion layers in an electrically floating state, and a control gate formed on the floating gate electrode with an insulating film interposed therebetween, wherein the first and second diffusion layers extend in parallel with each other along the longer side of the floating gate electrode, the control gate extends in parallel with the shorter side of the floating gate electrode, the first and second diffusion layers extend across and pass under the control gate electrode, and that portion of the first diffusion layer which is positioned adjacent to the floating gate electrode differs in impurity concentration from that portion of the second diffusion layer which is positioned adjacent to the floating gate electrode.

The particular construction of the present invention permits a marked reduction in the electrical resistance of the control gate electrode, making it possible to improve the operating speed of the device. Also, this particular construction permits the elimination of a contact hole, making it possible to markedly reduce the cell size. What should also be noted is that one of the two diffusion layers having the floating gate electrode interposed therebetween is made lower in impurity concentration than the other diffusion layer. In other words, an asymmetrical cell structure is employed in the present invention so as to prevent erroneous unintentional information writing in the adjacent cell.

BRIEF DESCRIPTION OF THE DRAWINGS

FIG. 3 is a plan view showing an example of a control gate electrode and a floating gate electrode employed in the present invention;

FIG. 4 is a plan view showing a semiconductor device according to one embodiment of the present invention;

FIG. 5 is a cross sectional view along line Y—Y shown in FIG. 4;

FIG. 6 is a cross sectional view along line X—X shown in FIG. 4;

FIG. 7 is a cross sectional view showing a semiconductor device according to another embodiment of the present invention;

DETAILED DESCRIPTION OF THE PREFERRED EMBODIMENTS

FIGS. 1 to 6 collectively show a semiconductor device in which the technical idea of the present invention is applied to the EPROM cell structure.

Figure 1:
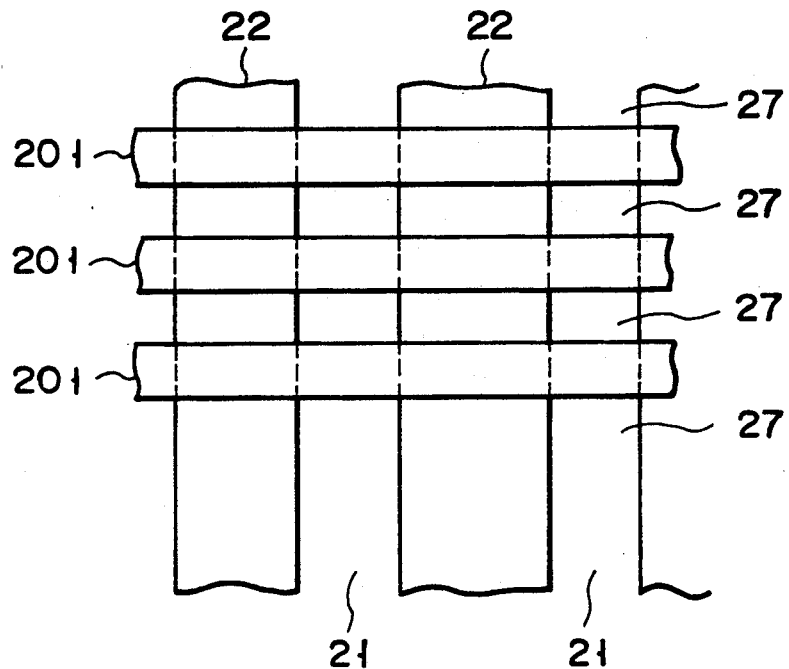
FIG. 1 is a plan view showing an example of the floating gate electrode pattern employed in the present invention.

As seen from FIGS. 1, 5 and 6, a floating gate electrode pattern 201 is formed in a memory cell-forming region on the surface of, for example, a p-type silicon substrate 21 with a gate insulation film 23 interposed therebetween. The pattern 201 is positioned on an element isolating region 22. Then, one of the element isolating regions 22 is removed in self-alignment with the floating gate electrode pattern 201, followed by forming a diffusion layer region in which a silicide layer 29, including diffusion layers 27 and 207, is to be formed by self-aligned manner.

Figure 2:
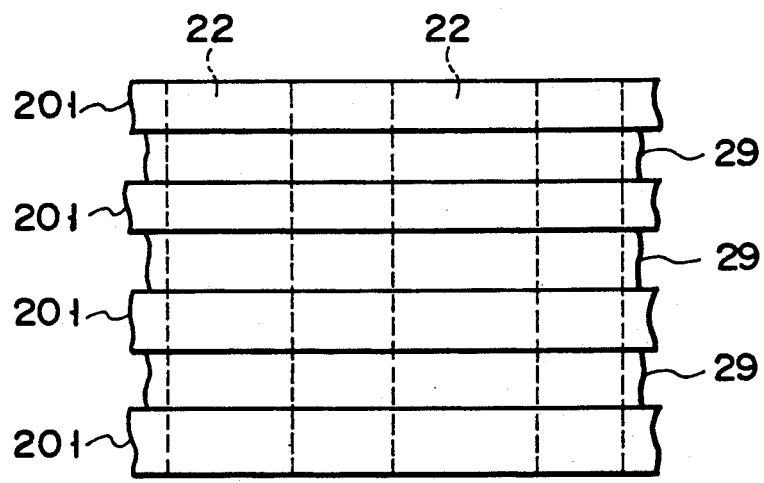
FIG. 2 is a plan view showing an example of a silicide layer employed in the present invention.
Figure 8:
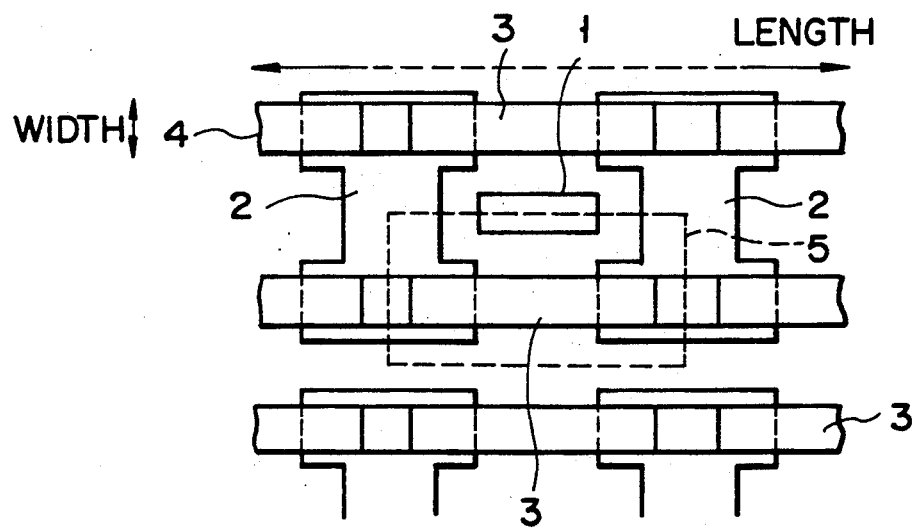
FIG. 8 is a plan view showing a conventional EPROM.
Figure 9:
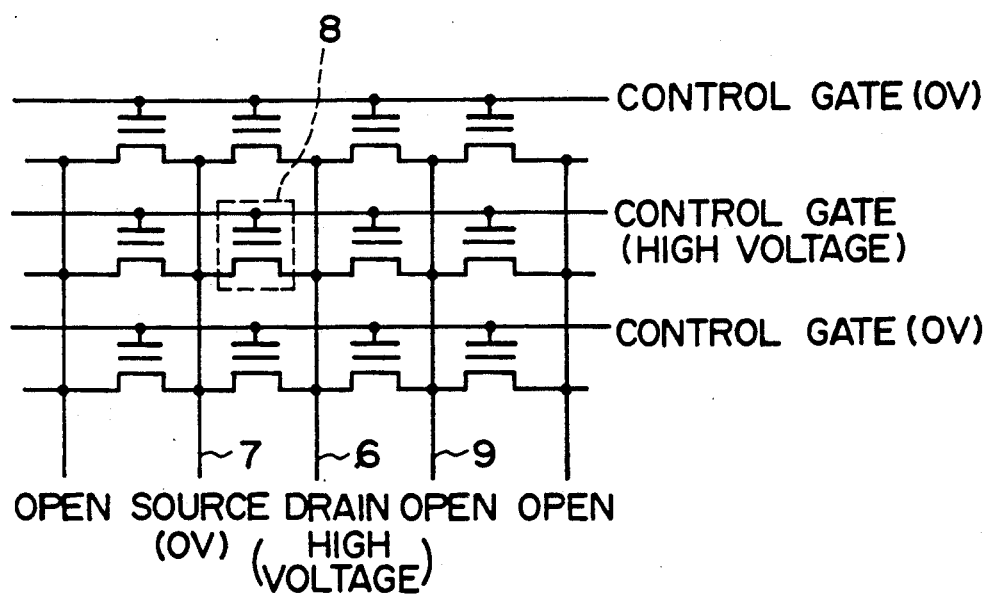
FIG. 9 is a circuit diagram of the conventional EPROM.

In the next step, a first diffusion layer 27 and a second diffusion layer 207, differing from the first diffusion layer 27 in impurity concentration, are formed, followed by a silicide layer 29, formed on layers 27 and 207 in self-aligned manner, as shown in FIG. 2. Further, an insulating layer 30 is selectively formed to cover only the silicide layer 29, followed by forming a control gate electrode 31 and a floating gate electrode 32. As shown in FIGS. 3, 5 and 6, insulating films 25 and 26 are interposed between the control gate electrode 31 and the floating gate electrode 32, and the control gate electrode 31 extends parallel with the shorter side of the floating gate electrode 32. Also, the width of the floating gate electrode in the direction of the longer side is approximately equal to the width of the control gate electrode. Finally, desired contact holes 33 and the metal wiring layers 34 are formed as shown in FIG. 4 so as to obtain the final structure. Incidentally, reference numeral 35 in FIGS. 5 and 6 denotes an insulating cover layer.

In the embodiment described above, the element isolation region 22 is formed in self-alignment with the floating gate electrode pattern 201. Also, the silicide layer 29 having a low electrical resistance is formed in a self-aligned fashion in parallel with the longer side of the floating gate electrode 32. Further, the control gate electrode 31 is formed in parallel with the shorter side of the floating gate electrode 32. The particular construction of the present invention permits markedly lowered wiring resistance of the control gate electrode 31, i.e., to about 1/6 of the wiring resistance of a conventional cell, making it possible to significantly improve the operating speed of the element. Also, the use of the silicide layer 29, having a low resistance, permits elimination of the contact hole, though a single contact hole is required for every two cells in the conventional cell structure, making it possible to further miniaturize the unit cell area. Also, in the manufacture of a semiconductor memory of the structure, a contact hole is not present substantially within the memory cell, with the result that a defect relating to the formation of the contact hole is not generated and, thus, a marked improvement in the yield of the semiconductor memory can be achieved. Further, during information writing, decoding is performed with the first diffusion layer 27 adjacent to the floating gate to be written on the side of a higher impurity concentration used as the drain and the second diffusion layer 207 adjacent to the said floating gate on a lower impurity concentration side used as the source. Thus, voltage is applied in the adjacent cell which shares the drain diffusion line such that the second diffusion layer 207 on the lower impurity concentration side acts as the drain, with the first diffusion layer 27 on the higher impurity concentration side acting as the source. Therefore, erroneous information writing can be sufficiently prevented in the present invention. On the other hand, when the information is read out, voltage is applied such that the second diffusion layer 207 on the lower impurity concentration side acts as the drain, with the first diffusion layer 27 on the higher impurity concentration side acting as the source, with the result that it is possible to make the drain voltage higher in the reading step so as to read out the information at a higher speed, without bringing about erroneous writing during read operation.

As described previously, the floating gate electrode 32 is located between the first diffusion layer 27 and the second diffusion layer 207 in the present invention. It is possible to form the first diffusion layer 27 and the second diffusion layer 207 such that the impurity concentration in that part of the second diffusion layer 207 which is positioned adjacent to the floating gate electrode 32 is many times lower than the impurity concentration in that part of the first diffusion layer 27 which is positioned adjacent to the floating gate electrode 32. In this case, the region of low impurity concentration, which is positioned adjacent to the floating gate electrode 32 in the second diffusion layer 207, can be formed 0.7 microns or less apart from the floating gate electrode 32 horizontally.

In the present invention, it is possible to define in a self-aligned fashion the length of the longer side of the floating gate electrode 32 and the width of the control gate electrode 31.

It is also possible to set the total length of the control gate electrode 31, connected to a single word line, at 2 to 2.5 times as much as the total length of the shorter sides of the floating gate electrodes 32 belonging to said single word line.

It is also possible to form the first diffusion layer 27 and the second diffusion layer 207 in a self-aligned fashion along the longer side of the floating gate electrode.

It is further possible for that portion of the first diffusion layer 27 which is positioned adjacent to the floating gate electrode 32 to contain arsenic.

It is also possible for that portion of the second diffusion layer 207 which is positioned adjacent to the floating gate electrode 32 to contain phosphorus.

It is moreover possible for the insulating layer 30, interposed between the wiring layer for the first and second diffusion layers and the wiring layer for the control gate electrode, to include a film prepared by thermal oxidation of the wiring layer for the first diffusion layer 27 and the second diffusion layer 207.

It is also possible for the insulating film 30 formed on the silicide film 29, covering the first diffusion layer 27 and the second diffusion layer 207, to consist of an oxide film having a thickness of 1,500 Å or more.

It is further possible for the floating gate electrode 32 to consist of a polysilicon layer.

It is also possible for the wiring layer for the control gate electrode 31 to consist of a polysilicon layer, a silicide layer or a combination of a polysilicon layer and a silicide layer.

Moreover, it is possible for the insulating films 25 and 26 formed on the floating gate electrode 32 to consist of an oxide film prepared by oxidizing a polysilicon layer.

It is also possible for the insulating films 25 and 26 formed on the floating gate electrode 32 to be of a laminate structure consisting of a silicon oxide film and a silicon nitride film.

Further, it is possible to form a laminate structure consisting of three insulating films 251, 26 and 252 between the floating gate electrode 32 and the control gate electrode 31, as shown in FIG. 7. In this case, it is possible for these insulating films 251, 26 and 252 to consist of an oxide film prepared by oxidizing a polysilicon film, a silicon nitride film and a silicon oxide film, respectively.

In the embodiment described above, the technical idea of the present invention is applied to an EPROM. However, it is also possible to apply the technical idea of the present invention to the manufacture of a semiconductor device having a gate electrode consisting of a plurality of layers.

As described above in detail, in the present invention the source diffusion layer and the drain diffusion layer of a nonvolatile memory cell are formed in parallel with each other along the longer side of the floating gate electrode. Also, the control gate electrode is formed in parallel with the shorter side of the floating gate electrode. Further, the source diffusion layer and the drain diffusion layer extend across the wiring layer for the control gate electrode at right angles. Still further, the length of the longer side of the floating gate electrode is set equal to the width of the control gate electrode. The particular construction of the present invention permits marked lowering of the resistance of the control gate electrode, so as to permit the element to operate at high speed. What should also be noted is that a silicide layer having a low electrical resistance is used for forming the wiring layers for the source and drain such that it is possible to omit a contact hole. As a result, the unit cell size can occupy the smallest area determinable by the element separating capability and the distance between adjacent gates. This particular construction permits marked miniaturization of the unit cell size, making it possible to provide a semiconductor memory having a large capacity. Still further, diffusion layers having the floating gate electrode sandwiched therebetween are formed with different impurity concentrations, i.e., a so-called "asymmetrical drain structure", making it possible to sufficiently prevent erroneous information writing in the adjacent cell.

What is claimed is:

1. A semiconductor device having a gate electrode consisting of a plurality of layers, comprising:
    a semiconductor substrate;
    a first diffusion layer formed in the substrate;
    a second diffusion layer formed in the substrate;
    a floating gate electrode formed in an electrically floating state on a channel region between the first diffusion layer and the second diffusion layer, such that the floating gate electrode extends in parallel with the longer sides of the first diffusion layer and the second diffusion layer;
    an insulating film formed on the floating gate electrode; and
    a control gate electrode formed on the insulating film such that the control gate electrode extends in parallel with the shorter side of the floating gate electrode, the said control gate electrode extending across the first diffusion layer and the second diffusion layer;
    wherein the impurity concentration in that part of the first diffusion layer which is positioned adjacent to the floating gate electrode differs from the impurity concentration in that part of the second diffusion layer which is positioned adjacent to the floating gate electrode.

2. The semiconductor device having a gate electrode consisting of a plurality of layers according to claim 1, wherein the length of the longer side of the floating gate electrode is equal to the width of the control gate electrode.

3. The semiconductor device having a gate electrode consisting of a plurality of layers according to claim 1, wherein that part of the first diffusion layer which is positioned adjacent to the floating gate electrode contains arsenic.

4. The semiconductor device having a gate electrode consisting of a plurality of layers according to claim 1, wherein that part of the second diffusion layer which is positioned adjacent to the floating gate electrode contains phosphorus.

5. The semiconductor device having a gate electrode consisting of a plurality of layers according to claim 1, wherein the insulating film interposed between the first diffusion layer, the second diffusion layer and the control gate electrode includes a thermal oxide film prepared by thermally oxidizing the first diffusion layer and the second diffusion layer.

6. The semiconductor device having a gate electrode consisting of a plurality of layers according to claim 1, wherein the insulating film formed on the first diffusion layer and the second diffusion layer consists of an oxide film having a thickness of 1500 Å or more.

7. The semiconductor device having a gate electrode consisting of a plurality of layers according to claim 1, wherein the floating gate electrode is formed of a polysilicon layer.

8. The semiconductor device having a gate electrode consisting of a plurality of layers according to claim 1, wherein the control gate electrode is formed of a polysilicon layer.

9. The semiconductor device having a gate electrode consisting of a plurality of layers according to claim 1, wherein the impurity concentration in that part of the second diffusion layer which is positioned adjacent to the floating gate electrode is one to two orders of magnitude lower than the impurity concentration in that part of the first diffusion layer which is positioned adjacent to the floating gate electrode.

10. The semiconductor device having a gate electrode consisting of a plurality of layers according to claim 1, wherein the insulating film formed on the floating gate electrode includes an oxide film prepared by oxidizing a polysilicon layer.

11. The semiconductor device having a gate electrode consisting of a plurality of layers according to claim 1, wherein the insulating film formed on the floating gate electrode is of a stacked structure consisting of a silicon oxide film and a silicon nitride film.

12. The semiconductor device having a gate electrode consisting of a plurality of layers according to claim 1, wherein the insulating film formed on the floating gate electrode is of a stacked structure consisting of an oxide film prepared by oxidizing a polysilicon film, a silicon nitride film and a silicon oxide film.

13. The semiconductor device having a gate electrode consisting of a plurality of layers according to claim 1, wherein the impurity concentration in that part of the second diffusion layer which is positioned adjacent to the floating gate electrode is lower than the impurity concentration in that part of the first diffusion layer which is positioned adjacent to the floating gate electrode.

14. The semiconductor device having a gate electrode consisting of a plurality of layers according to claim 13, wherein the first diffusion layer acts as the drain and the second diffusion layer acts as the source when the device performs the information writing function.

15. The semiconductor device having a gate electrode consisting of a plurality of layers according to claim 13, wherein the first diffusion layer acts as the source and the second diffusion layer acts as the drain when the device performs the information reading function.

16. The semiconductor device having a gate electrode consisting of a plurality of layers according to claim 13, wherein that part of the second diffusion layer which is positioned adjacent to the floating gate electrode and has a lower impurity concentration is located 0.7 micron or less apart from the floating gate electrode in the vertical direction.

* * * * *